United States Patent [19]

Shiota

[11] Patent Number: 5,086,011
[45] Date of Patent: Feb. 4, 1992

[54] PROCESS FOR PRODUCING THIN SINGLE CRYSTAL SILICON ISLANDS ON INSULATOR

[75] Inventor: Philip S. Shiota, Saratoga, Calif.

[73] Assignee: Advanced Micro Devices, Inc., Sunnyvale, Calif.

[21] Appl. No.: 147,892

[22] Filed: Jan. 25, 1988

Related U.S. Application Data

[63] Continuation-in-part of Ser. No. 7,312, Jan. 27, 1987, abandoned.

[51] Int. Cl.$^5$ .................................. H01L 21/302
[52] U.S. Cl. ................................. 437/61; 437/225; 437/228; 437/247; 156/643; 156/657; 148/DIG. 135; 148/DIG. 12

[58] Field of Search ............... 437/238, 228, 225, 239, 437/241, 247, 247, 61; 148/DIG. 135, DIG. 12; 156/643, 653, 657

[56] References Cited

PUBLICATIONS

Su, S. C., "Low-Temperature . . . ", Solid State Technol., pp. 72-82, Mar. 1981.

Primary Examiner—Brian E. Hearn
Assistant Examiner—Kevin McAndrews
Attorney, Agent, or Firm—Steven F. Caserza

[57] ABSTRACT

A semiconductor fabrication process uses an epitaxial layer as an etch stop in a plasma etch process. In one embodiment, mechanical stops and an epitaxial layer are used in combination for stopping precisely at a desired end point.

31 Claims, 10 Drawing Sheets

PROCESS FOR PRODUCING THIN SINGLE CRYSTAL SILICON ISLANDS ON INSULATOR

CROSS-REFERENCE TO RELATED APPLICATION

This patent application is a continuation-in-part of U.S. application Ser. No. 007,312 filed Jan. 27, 1987, abandoned.

BACKGROUND OF THE INVENTION

This invention relates to the manufacture of integrated circuits and specifically the process of fabricating discrete semiconductor islands in a substrate which are electrically isolated from each other.

DESCRIPTION OF THE PRIOR ART

During the manufacture of integrated circuits, the semiconductor elements are usually isolated from each other by a process known as "junction isolation". This junction isolation is used in both MOS and bipolar circuits to electrically isolate circuit elements. Under normal applications, junction isolation is usually an acceptable means to obtain circuit isolation. However, under adverse conditions such as in a radiation environment or under extreme high voltages, junction isolation is not effective and leads to circuit failure.

There are integrated circuits produced by separating circuit elements with vertical dielectric layers. An additional horizontal dielectric layer under the elements leads to a dielectrically isolated semiconductor region. The technology for producing prior art dielectrically isolated layers on insulating substrates requires extreme dimensional controls which results in dielectrically isolated single crystal islands of about 15 micrometers thickness with a tolerance of ±5 micrometers. Integral to the prior art dielectric process is a costly polycrystalline silicon deposition. This process is usually a high temperature step at about 1250° C. for 6 hours. This high temperature step precludes the inclusion of any junction in the original semiconductor structure without allowing for substantial junction diffusions. This process also consumes large amounts of expensive chemicals for the deposition of large thicknesses of polycrystalline silicon.

Additionally, as shown in FIG. 1a, it is typically required that trenches be formed in substrate 42 and oxide 41 prior to formation of polycrystalline silicon 40. Following a backlap operation which roughly removes portions of substrate 42, oxide 41 serves as a stop during a chemical mechanical polish removal of the remaining undesired portions of substrate 42. Typically, approximately 50% to 70% of the wafer surface area at stop line 45a is oxide 41. This, of course, is undesirable since it significantly reduces the area available for the formation of active devices. Furthermore, great skill and good machine control is required to polish to the above tolerances. Because there is a finite practical mechanical tolerance for parallelism, the largest wafers which can be processed in the above manner has been 4 inch wafers at a great cost in yield. As a result, the usual wafer size manufactured using the prior art methods is 3 inches.

FIG. 1b depicts the result of nonparallel wafer removal. The solid lines in FIG. 1b depict the resulting structure including polycrystalline silicon handle 40, insulation 41, and to-be-formed isolated regions of single crystal semiconductor 21. As shown in FIG. 1a by stop line 45a, ideally the thicknesses of isolated semiconductor regions 21 are uniform across the width of the wafer. However, as indicated by stop line 45b in FIG. 1b, when handle 42 is removed in a nonparallel fashion, the thickness of isolated semiconductor regions 21 vary greatly over the width of the wafer. Such nonparallel removal is, unfortunately, a standard limitation in prior art processes.

Such prior art techniques for providing dielectrically isolated semiconductor regions are descibed, for example, in U.S. Pat. Nos. 4,501,060; 4,056,414; 4,004,046; 3,423,255; 3,832,247; 3,738,883; and 3,913,121.

On the other hand, silicon-on-sapphire processes give good dimensional control, but have peformance limitations due to the degradation of electrical properties in comparison to dielectrically isolated silicon. Silicon-on-sapphire processes are described, for example, in "A Comparison of Fine-Dimension Silicon-on-Sapphire and Bulk-Silicon Complementary MOS Devices and Circuits", Brassington et al., IEEE Transactions on Electron Devices, Vol, ED-32, No. 9, September, 1985, pages 1858–1867, and "The Current Status of Silicon-on-Insulator Technologies—a Comparisn", S. L. Partridge, International Electron Device Meeting, 1986, pages 428–430.

However, silicon-on-sapphire has the disadvantage that the single crystal silicon formed on the sapphire substrate is not capable of being fabricated as a good single crystal, with inherent compromises of electrical properties. For example, in SOS devices, junction leakage is on the order of 10 to 100 times that of junction leakages present in bulk silicon.

Another prior art technique is called SIMOX. In the SIMOX process, oxygen atoms are implanted with high energy into a silicon substrate in order to place oxygen atoms horizontally at a selected depth in the silicon substrate. A subsequent heat treatment causes these oxygen atoms to combine with the silicon substrate in order to form a horizontal layer of silicon dioxide insulator. However, a disadvantage of the SIMOX process is severe dislocations within the silicon substrate due to the high energy implantation of oxygen. Another disadvantage is the horizontal dielectric layer generated by the oxygen implant can be only thousands of angstroms in thickness, limiting the isolation to lower electrical voltages.

Another prior art process for forming electrically isolated silicon regions is the zone melt refining (ZMR) process. In ZMR, a polycrystalline layer is deposited on an electrical insulator and an attempt is made to form the polycrystalline into a monocrystalline silicn layer, for example, by heat treatment using a laser. However, the ZMR process does not provide a true monocrystalline silicon layer, but rather relatively small regions of single crystals having grain boundaries which have a deleterious effect on the electrical properties of the layer.

SUMMARY

The disadvantages of the aforementioned prior art processes are eliminated by the present invention where an epitaxial layer is used as an etch stop in a plasma etch process. This epitaxial layer can be as thin as 0.3 micrometers. Thick layers have the disadvantage of using more surface area to isolate than thin layers, and therefore will be less efficient in surface area utilization. In one embodiment, mechanical stops and an epitaxial layer are used in combination for stopping precisely at a desired end point. An additional advantage is that lower cost, scrap wafers or other material may be used in this process to form the handle of the silicon on insulator substrate. Junctions and epitaxial layers can be preserved in this process because heat cycles are lower and shorter than those required in prior art dielectric isolation processes.

BRIEF DESCRIPTION OF THE DRAWINGS

The drawings illustrate a preferred embodiment of the invention as follows.

DETAILED DESCRIPTION

In the following description, it is assumed that a generalized integrated circuit (e.g. bipolar or "MOS") will be fabricated. In applications where ionizing radiation or other "hostile environments" may be encountered, it is desired that active elements in integrated circuits be dielectricaly isolated from each other. This type of isolation improves circuit survival by several times that of its junction isolated counterpart.

The description of the preferred embodiment will cover the development of a dielectrically isolated N or P type silicon film, as desired. The N or P type silicon film is an integral part of this invention in that this layer acts as an etch stop.

Figure 1A:
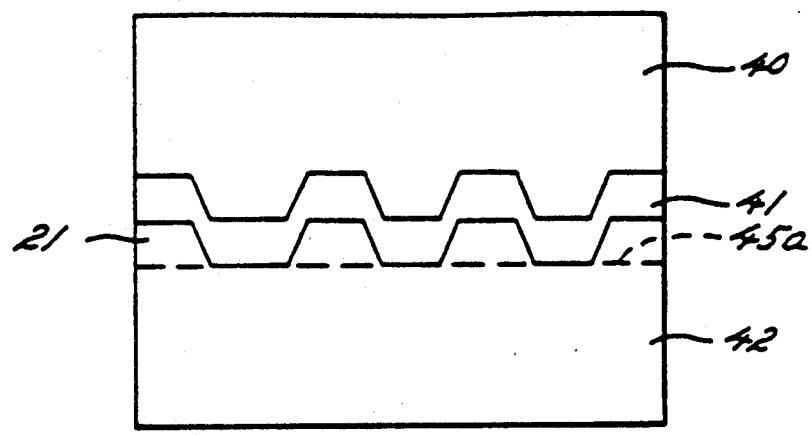
FIGS. 1a depicts an ideal formation of dielectrically isolated single crystal semiconductor region.
Figure 1B:
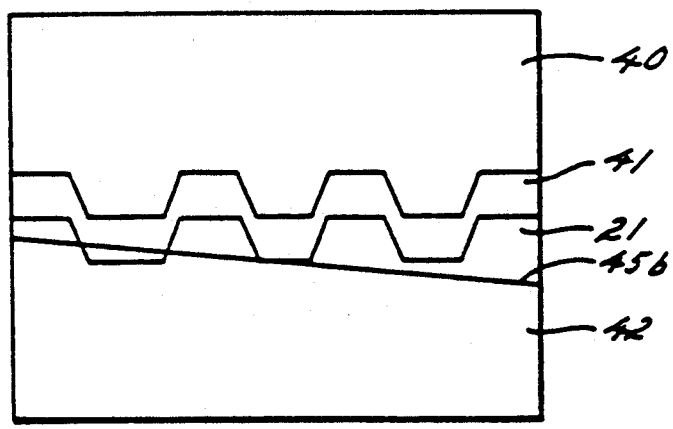
FIG. 1b depicts the disadvantages of prior art techniques for forming dielectrically isolated single crystal regions, where backlapping is employed.
Figure 2A:
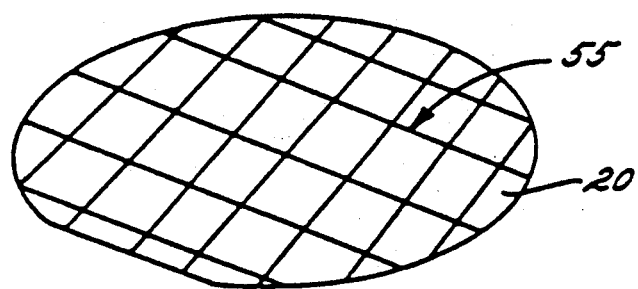
FIGS. 2a and 2b depict scribe lines on a semiconductor wafer.
Figure 2B:
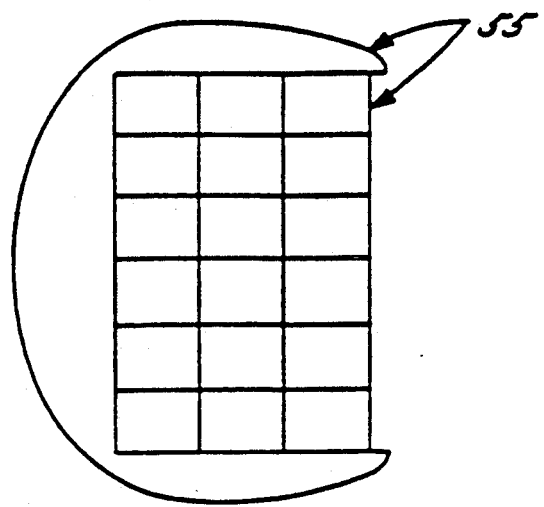

FIG. 2a illustrates the scribe line grids on semiconductor wafer 20. Grids 55 are formed in nitride, polycrystalline silicon, or some other suitable material to function as a mechanical stop during a subsequent mechanical backlap operation. FIG. 2b is an edge detail where incomplete die are shown to become solid scribe lines, providing a greater stop area without a decrease in the number of whole die.

Figure 3:
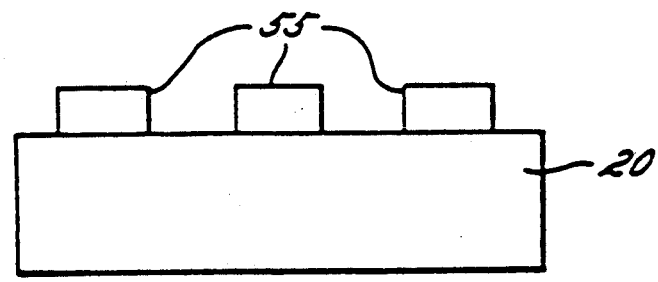
FIGS. 3 through 10a depict one embodiment of a process of this invention.
Figure 4:
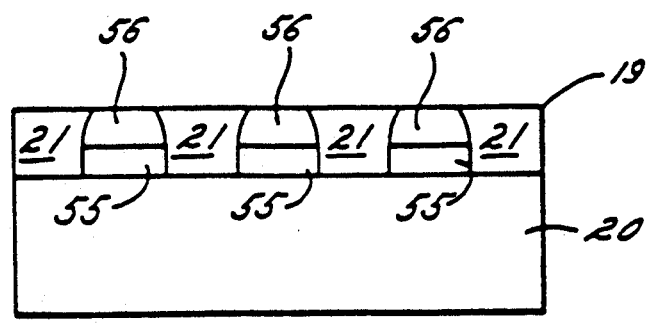

FIG. 3 shows a cross section of scribe line grid 55 formed of oxide or nitride on semiconductor substrate 20. In FIG. 4, an epitaxial semiconductor layer 21 is grown on substrate 20. The growth is monocrystalline in areas 21 not covered by oxide or nitride and polycrystalline in areas 56 over the nitride or oxide scribe grid 55. It is essential that the junction between epitaxial layer 21 and substrate 20 be as abrupt as possible, as this difference in dopant concentration is utilized to achieve selectivity in a later etch step. Thus, epitaxial layer 21 is preferably grown to a thickness on the order of 0.3 to 15 micrometers at low temperatures, preferably below approximately 1000° C. Silane, reduced pressure epitaxy, and molecular beam epitaxy are examples of suitable techniques used for growing epitaxial layer 21, as is well known in the art. A brief polish of surface 19 of layer 21 is performed at this time in order to provide a flat, uniform surface upon which oxide layer 22 (FIG. 5) is to be formed as uniformly as possible. If desired, sub-diffusions (such as a buried collector) are performed at this time, and/or retrograde p wells or n wells (i.e. being more highly doped near surface 19 than deeper within epitaxial layer 21) are conveniently formed at this time, since surface 19 will become the bottom of the isolated wells. The use and formation of sub-diffusions and retrograde wells are known to those of ordinary skill in the art.

Figure 4A:
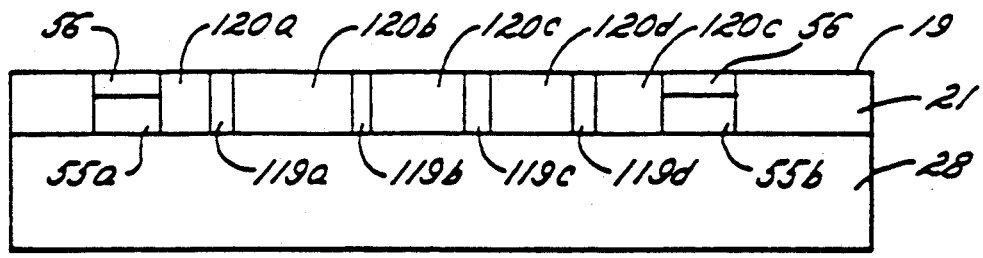

As shown in FIG. 4a, at this time isolation regions 119a through 119d can be formed within epitaxial silicon layer 21 between the single die defined by scribe grid portions 55a and 55b. By the use of isolation region 119a through 119d, which extend through the entire thickness of epitaxial layer 21, individual, dielectrically isolated portions 120a through 120e of epitaxial layer 21 are formed between scribe grid portions 55a and 55b. Isolation regions 119a through 119d are formed, for example, by local oxidation of silicon, using a suitable oxidation mask, such as silicon nitride. Alternatively, isolation regions 119a through 119d are formed by etching trenches, such as by reactive ion etching (RIE) and filling the trenches with a suitable isolation material, such as silicon dioxide or silicon nitride. Naturally, as will be appreciated to those of ordinary skill in the art, any desired number of isolation regions 119a through 119d can be used, thereby providing any desired number of dielectrically isolated single crystal silicon regions 120a through 120e within each of the die contained on a wafer, the individual die being separated by scribe lines 55a and 55b.

In an alternative embodiment of this invention, as depicted by FIGS. 5 to 10a, the isolation regions are not formed at this time, but rather are formed after removal of substrate 20, as is described in more detail later.

Figure 5:
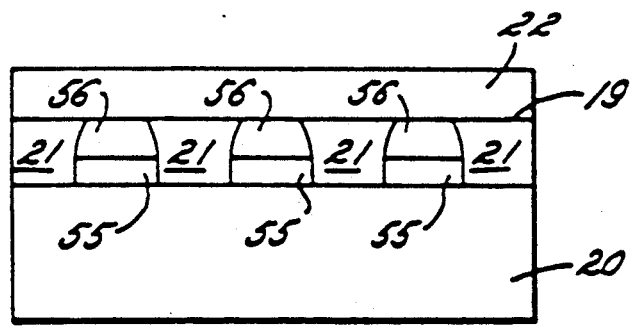

As shown in FIG. 5, oxide layer 22 is then formed, e.g. to a thickness of about 1000 Å to 10,000 Å by thermal oxidation, the preferred method is the use of high pressure oxidation at or around 700° C. in a high pressure oxidation furnace at or around 15 to 25 atmospheres pressure (in steam). This method of oxide growth results in a hydrated oxide containing a relatively high concentration of OH−.

Figure 6:
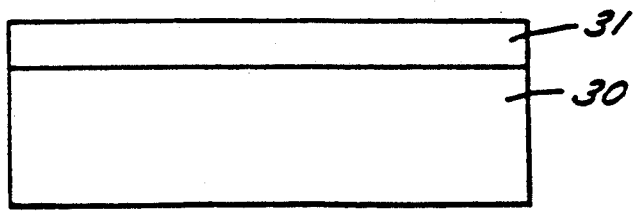
Figure 7:
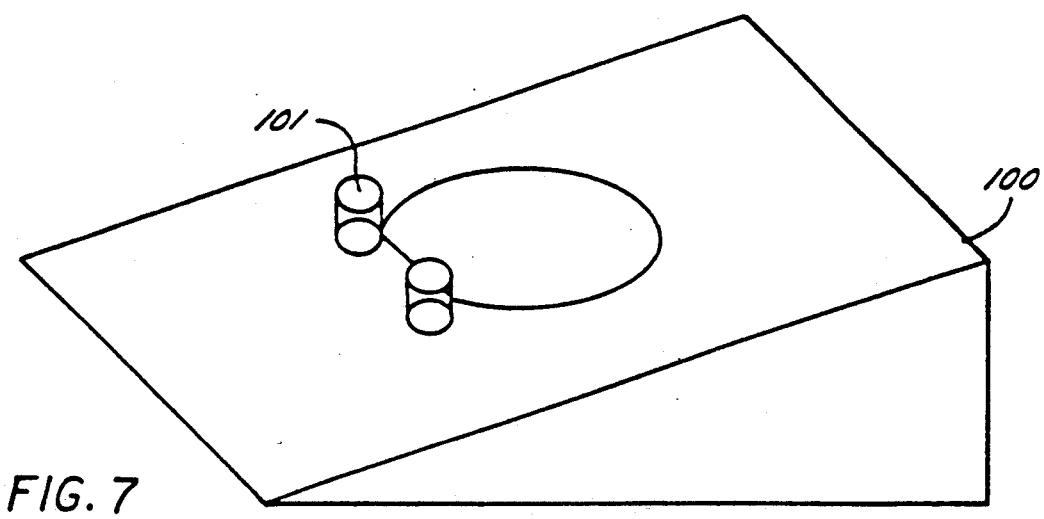
Figure 8:
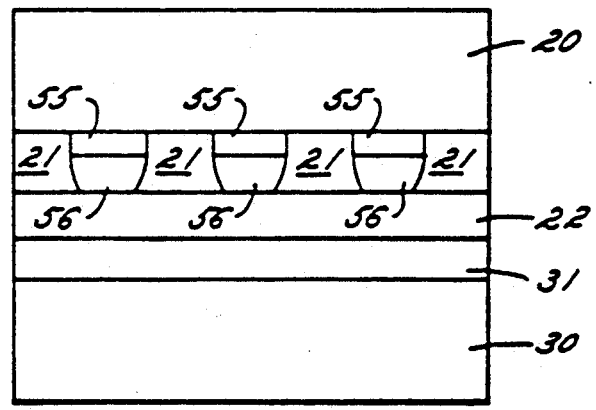

The "handle" portion of the dielectrically isolated wafer is now formed as shown in FIG. 6. A handle or base wafer 30 (sapphire, alumina or other substrates may be used) is oxidized at or around 700° C. in a high pressure oxidation furnace at or about 15 to 25 atmospheres pressure (in steam) to form oxide layer 31 (typically about 1000 Å to 10,000 Å thick), or oxide layer 31 may be eliminated and the attachment to the oxide layer 22 (FIG. 5) may be made directly to handle 30. This attachment is accomplished by placing the surfaces of oxide layer 22 and oxide layer 31 (or the surface of handle 30, if oxide layer 31 is not used) together in a jig, such as is shown in FIG. 7, in contact with each other and heating in a steam oxidizing atmosphere, and a pressure of 15 to 25 atmospheres, at a temperature of 700° C. to 1000° C. for approximately 30 to 60 minutes. Layer 22 and layer 31 (or layer 30, when oxide layer 31 is not used) thereby become bonded together as shown in FIG. 8. Oxide layer 22 is now attached to oxide layer 31 (or handle substrate 30).

This attachment may also be accomplished by subjecting the wafer of FIG. 5 and the handle of FIG. 6 to a low temperature (typically within the range of approximately 400° C. to 900° C.) hydraton bake of approximately 5 hours in a wet oxidizing ambient, of a type well known for the growth of oxides. This hydration bake causes $OH^-$ groups to be introduced into the surfaces to be joined, and increases the thickness of oxide layers 21 and 31 slightly. The two surfaces 22 and 31 to be joined are then placed on the jig of FIG. 7 in contact with each other and heated to the range of approximately 1050° C. to 1200° C. in an oxidizing atmosphere (preferably a wet oxidizing atmosphere) for approximately one hour. Layer 22 and layer 31 thereby become bonded together, as shown in FIG. 8.

If desired, in accordance with the teachings of this invention, the jig (FIG. 7) on which the two surfaces 22 and 31 which are to be joined are placed is essentially an inclined plane 100 with one or more stops 101 located near its lower side. The elements to be joined together are placed on this jig against the one or more stops such that during the joining process they are not rigidly fixed. In this manner, the two surfaces to be joined are relatively free to expand during the joining process, for example, due to thermal expansion.

Figure 9:
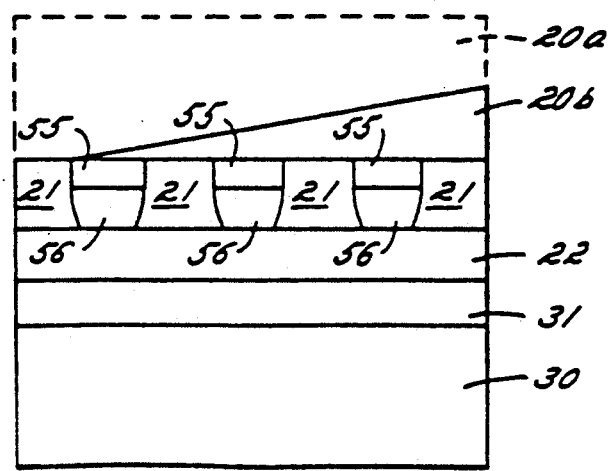

As shown in FIG. 9, the wafer is polished or "back lapped" to coarsely remove a major portion 20a of substrate 20. Of importance, parallel removal of portion 20a of substrate 20 is not necessary. The mechanical removal is terminated on the first contact to the nitride or oxide layer 55 which, as previously described, serves as a mechanical backlap stop. Of importance, in accordance with the teachings of this invention, it is not necessary to ensure the parallel removal of layer 20 mechanically and to stop uniformly on layer 55. Attempts to do so will lead to "washed out" areas and "dished" areas from excessive mechanical polishing. These problems are well known to those skilled in the art.

Figure 10:
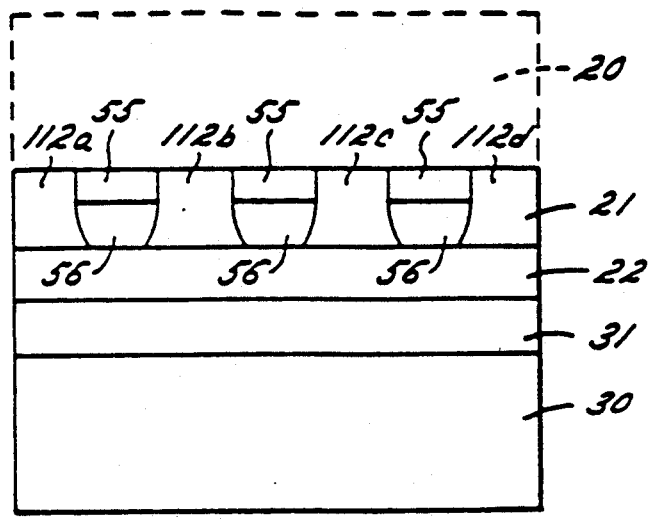

As shown in FIG. 10, remaining portions 20b of substrate 20 are then completely removed by plasma etching in an appropriate fluorocarbon based chemical plasma. This results in a plurality of single crystal semiconductor regions 112a through 112d, which are very effectively isolated by oxide layer 22 and oxide regions 56.

By way of example, the following plasma etcher parameters were used to carry out the process of this invention:
Drytek Quad R. I. E. Plasma etcher model number 824.
Pressure: 450 millitorr.
Power: 400 watts on a 9.0 inch diameter aluminum electrode with a 4.0 inch wafer.
Bias: 10 volts.
Electrode Spacing: 1.75 inches.
Etchants: 20 sccm Freon 12, and 80 sccm chlorine.

The dopant concentration in the substrate was greater than 10E20 atoms/cc, and the dopant concentration in the epitaxial layer was less than 10E15 atoms/cc.

Figure 11:
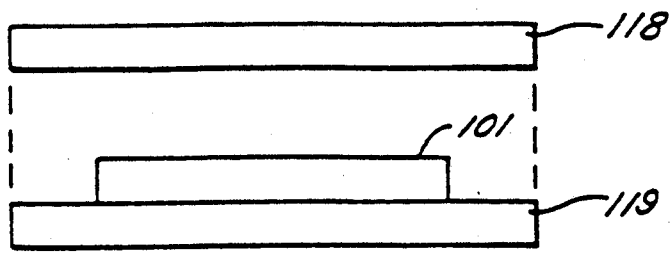
FIG. 11 depicts the introduction of RF energy in a plasma to joined substrates in accordance with the teachings of this invention.

As shown in FIG. 11, the RF plasma is preferably introduced from electrode 119 to substrate 101 through handle substrate 30 (for example, in FIG. 10), with electrode 118 connected to ground. It is believed that the current flows easily through the more highly doped substrate 20 (dopant concentrations greater than 10E20/cc) and not so easily through the more lightly doped or intrinsic epitaxial layer 21 (dopant concentration less than 10E15/cc). It is believed that this differential in current flow causes a charge buildup on the P− or N− or intrinsic layer 21, thereby providing a more favorable (with regard to etching) bias voltage on the more highly doped substrate 20. It has been found that with certain fluorocarbon chemical plasmas (e.g., Freon 12) a polymer film is deposited preferentially on the charged surfaces of layer 21. This polymer deposition effectively stops all etching of layer 21 in the plasma. Thus, a substantially high etching selectivity ratio between layers 21 and layer 20 has been established.

An alternative method is to use plasma chemistry to etch and detect epitaxial layer 21 as a stop. Highly doped (e.g. P++) silicon is used as substrate layer 20 and the fall off in boron concentration is laser or optically detected when the P++ silicon is etched through and the more lightly doped epitaxial layer 21 is reached. In addition, the advantage of using P++ silicon is that heavily doped boron silicon etches about 10 to 20 times faster than lightly doped N type silicon. This etch ratio may be improved by the use of electrical bias on the substrate. The etch rate of P++ silicon in plasma is 1.5 to 2.0 microns/minute. Therefore, the alternative method would be to use a plasma etcher and detect for the loss of the boron signal as the substrate is etched.

Alternatively, as described above, N++ can be substituted for the P++ layer above, and detection of arsenic or antimony may be used. In the case of N++ to N− silicon, an etch ratio of about 15 times can be attained. Specifically, we have found that N++ silicon etches about 15 times faster than N− silicon. The etch rate of N++ in a chlorine plasma is 0.15 to 0.35 microns/minute. The conditions for the above operation are the same as above, except that a gas flow of 200 sccm, and a pressure of 600 millitorr were used.

Figure 10A:
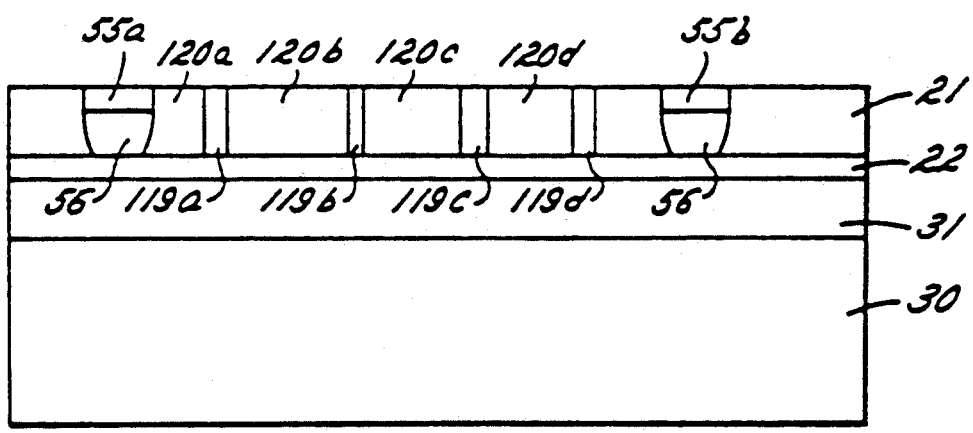

As shown in FIG. 10a, when isolation regions 119a through 119d are not formed earlier, as in the embodiment of FIG. 4a, isolation regions 119a through 119d are now formed within epitaxial silicon layer 21 between the single die defined by scribe grid portions 55a and 55b. Isolation regions 119a through 119d are formed, for example, by local oxidation of silicon, using a suitable oxidation mask, such as silicon nitride. Alternatively, isolation regions 119a through 119d are formed by etching a trench, such as by reactive ion etching (RIE) and filling the trenches with a suitable isolation material, such as silicon dioxide or silicon nitride.

Figure 12:
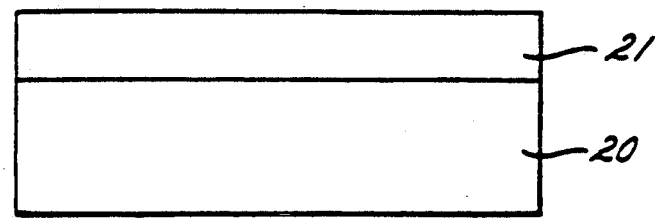
FIGS. 12 through 18a depict an alternative method of this invention.
Figure 13:
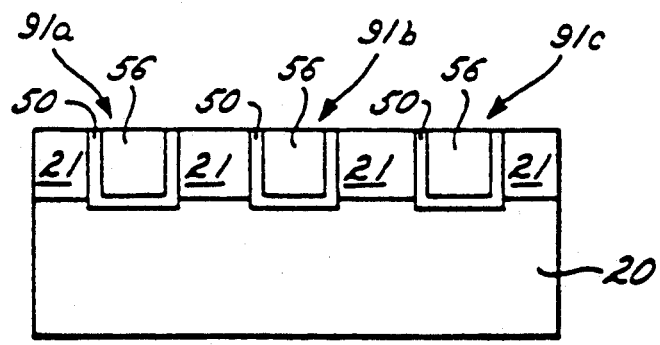

An alternative method shown in FIGS. 12 through FIG. 18 will now be described. FIG. 12 shows the starting substrate 20 with epitaxial layer 21 attached. FIG. 13 shows the wafer after a trench etch (such as reactive ion etching) has been used to form trenches 91a, 91b, and 91c through epitaxial layer 21. As shown in FIG. 13, the sides and bottom of trenches 91a–91c are covered with insulation layer 50 (such as oxide or nitride), and subsequently filled, such as with polycrystalline silicon 56. The surface of epitaxial layer 21 is then lightly polished in order to remove insulation 50 and fill region 56 from the surface areas of epitaxial layer 21. If desired, bottomside processing is performed, such as subdiffusions and retrograde P well or N wells as is known in the art.

Figure 13A:
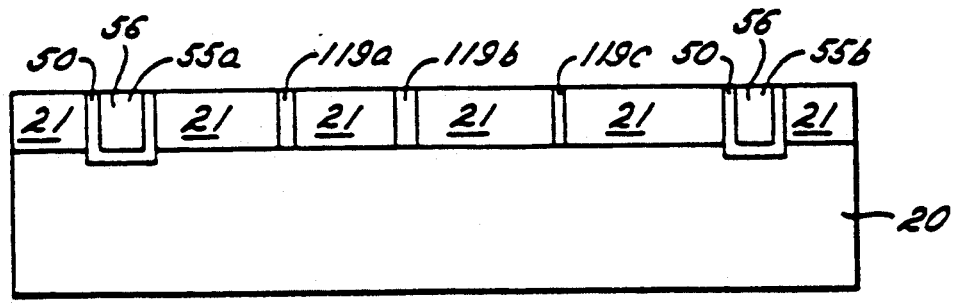

As shown in FIG. 13a, in one embodiment isolation regions 119a through 119c are now formed within epitaxial silicon layer 21 between the single die defined by scribe grid portions 55a and 55b. Isolation regions 119a through 119c are formed, for example, by local oxidation of silicon, using a suitable oxidation mask, such as silicon nitride. Alternatively, isolation regions 119a through 119c are formed by etching a trench, such as by reactive ion etching (RIE) and filling the trenches with a suitable isolation material, such as silicon dioxide or silicon nitride. This trench formation and fill may be performed simultaneously with the formation of scribe grid portions 55a, 55b, or may be performed as a separate step.

In an alternative embodiment of this invention, as depicted by FIGS. 14 through 18a, isolation regions 119a through 119c are not formed at this time, but rather are formed after removal of substrate 20, as is described in more detail later.

Figure 14:
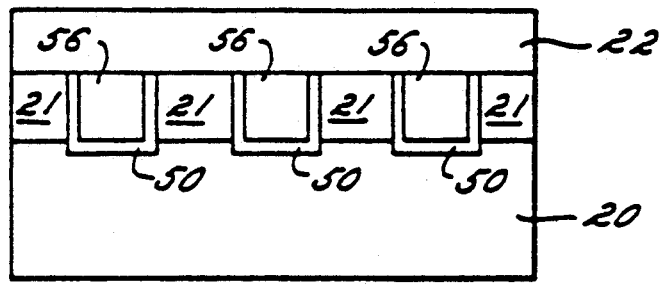
Figure 15:
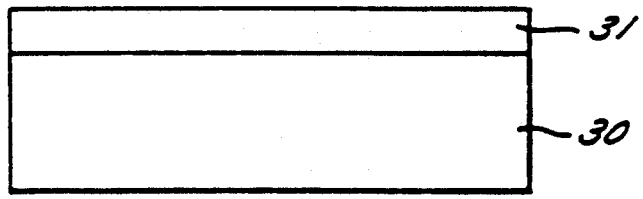
Figure 16:
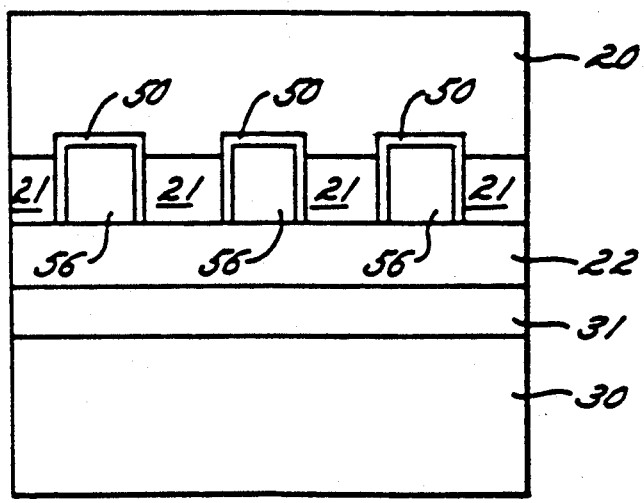
Figure 17:
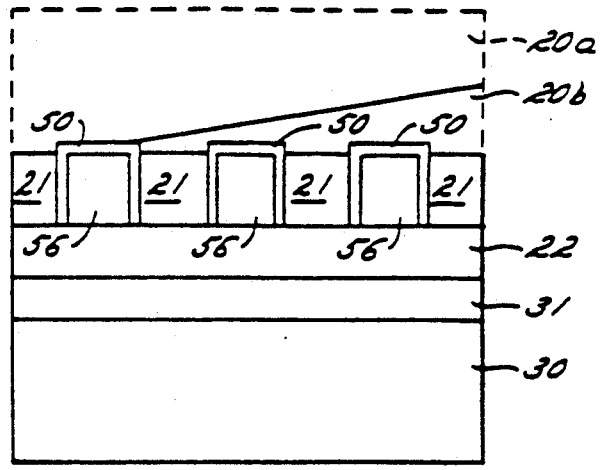
Figure 18:
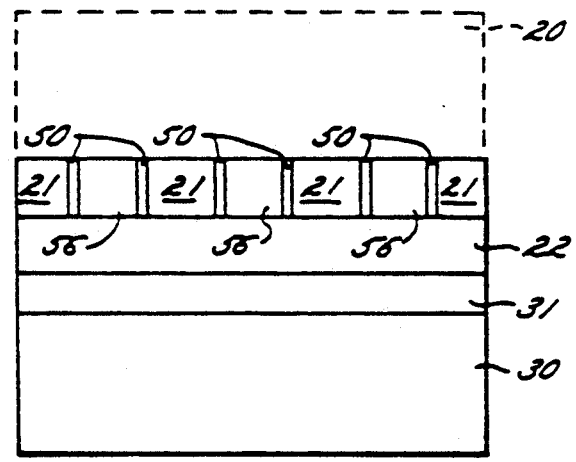

As shown in FIG. 14, oxide layer 22 is formed on the surface of the wafer, preferably at or around 700° C. in a high pressure oxidation furnace at or around 15 to 25 atmospheres pressure (in steam). FIG. 15 shows the handle wafer with oxide layer 31, which may be formed in a similar manner as oxide layer 22 of FIG. 14. FIG. 16 depicts the wafer of FIG. 14 and handle of FIG. 15 after bonding, for example using the bonding technique previously described. FIG. 17 depicts the structure of FIG. 16 after a mechanical polish removal step has removed portion 20a of substrate 20, such polish operation stopping upon first reaching insulation region 50 and filler layer 56. FIG. 18 depicts the finished substrate after the selective plasma etch (previously described), which removes the remaining undesired portions of substrate 20.

Figure 18A:
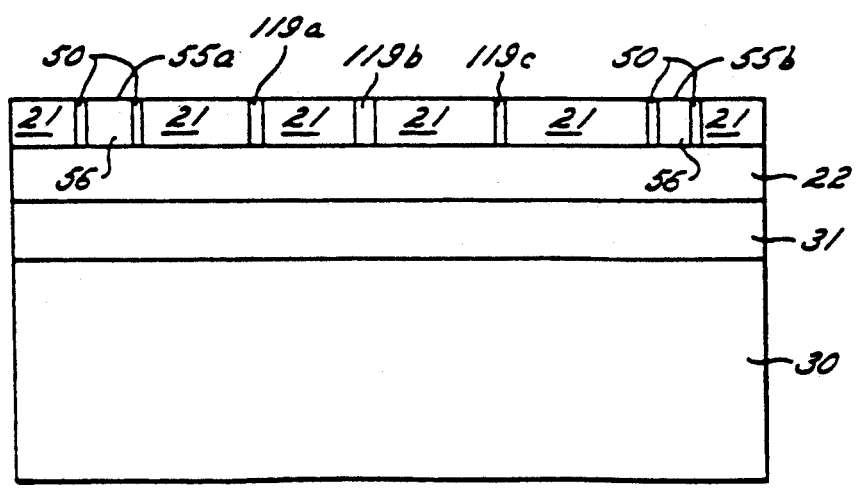

As shown in FIG. 18a, when isolation regions 119a through 119c are not formed earlier, as in the embodiment of FIG. 13a, isolation regions 119a through 119c are now formed within epitaxial silicon layer 21 between the single die defined by scribe grid portions 55a and 55b. Isolation regions 119a through 119c are formed, for example, by local oxidation of silicon, using a suitable oxidation mask, such as silicon nitride. Alternatively, isolation regions 119a through 119c are formed by etching a trench, such as by reactive ion etching (RIE) and filling the trenches with a suitable isolation material, such as silicon dioxide or silicon nitride.

Figure 19A:
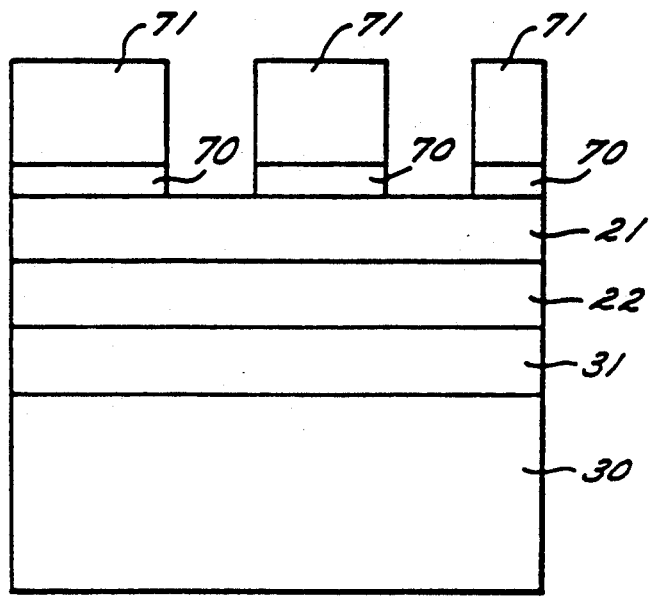
FIGS. 19a and 19b depict one method for formation of isolation regions in accordance with the teachings of this invention.
Figure 19B:
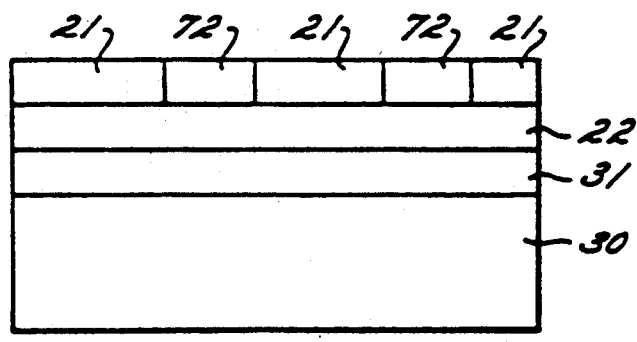

FIGS. 19a and 19b illustrate suitable teachings for the formation of isolation regions in accordance with the various embodiments of this invention (such as regions 119a et al. of FIGS. 4a, 10a, 13a, and 18a) for example, either through local oxidation techniques or partial etching and selective oxidation steps. As shown in FIG. 19a, a masking step is employed to define the locations where local oxidation is to take place in order to electrically isolate remaining portions of epitaxial layer 21. For example, a layer 70 of silicon nitride may be employed, typically 1000 to 2000 Å thick. Silicon nitride layer 70 can be applied by any convenient means, including low pressure chemical vapor deposition, as is well known in the art. A layer of photoresist 71 is then applied to the surface of the wafer and patterned, as is well known in the art, in order to expose those portions of epitaxial layer 21 which are to be oxidized to form oxide isolation regions 72 (FIG. 19b). Portions of nitride layer 70 which are exposed by the patterned layer of photoresist 71 are then removed, for example by plasma etching with a suitable fluorocarbon. The underlying portions of epitaxial layer 21 are now exposed and ready for oxidation. The remaining portions of photoresist layer 71 are removed, and the exposed portions of epitaxial layer 21 are oxidized in order to form oxide isolation region 72 of FIG. 19b. This oxidation step may be performed, for example, by thermal oxidation in wet oxygen at approximately 1000° to 1200° C. for several hours. Alternatively, oxide 72 is formed by first removing the portions of epitaxial layer 21 which are exposed by patterned nitride 70 (for example by plasma etching with SF₆), and depositing oxide 72, for example by low pressure chemical vapor deposition, as is well known in the art.

Regardless of how oxide 72 is formed, following formation of oxide 72, the wafer consists of an N type epitaxial layer separated into islands entirely isolated by oxide or any chosen isulator such as silicon nitride. In an alternative embodiment, the isolation regions are formed after formation of epitaxial layer 21 (FIG. 4 or 13) for example by a technique similar to that described above with regard to the embodiment where the isolation regions are formed after joining of the wafer and the handle. Thus, in this alternative embodiment, vertical dielectric isolation regions are formed after the formation of epitaxial layer 21 by masking the surface of epitaxial layer 21 with a nitride layer (not shown) and oxidizing those portions of epitaxial layer 21 which are decided to be converted to dielectric isolation regions.

In another embodiment of this invention, the selective etching technique of this invention is used to etch a first region having a first dopant concentration while not etching a second region having a second doping concentration.

One use of this invention is to make narrow regions, for example gate electrodes of FET devices. In this embodiment, a semiconductor layer is masked, and the selective etching techniques used to remove exposed portions of the semiconductor layer. For example, the mask can be used as a dopant mask during an ion implantation step which increases the dopant concentration of the portion of the semiconductor layer which is to be removed.

Figure 20A:
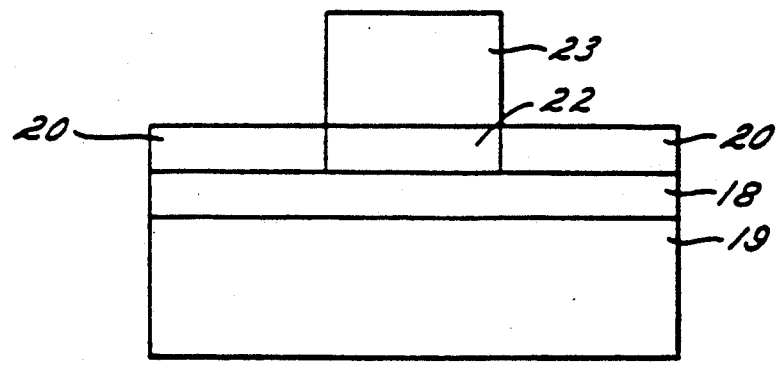
FIGS. 20a through 20c depict the use of the teachings of this invention to perform selective etching of a first region with respect to a second region.
Figure 20B:
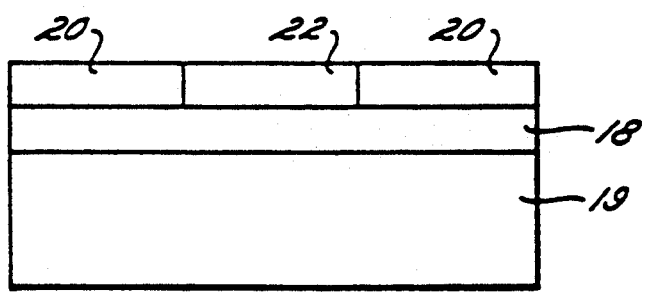
Figure 20C:
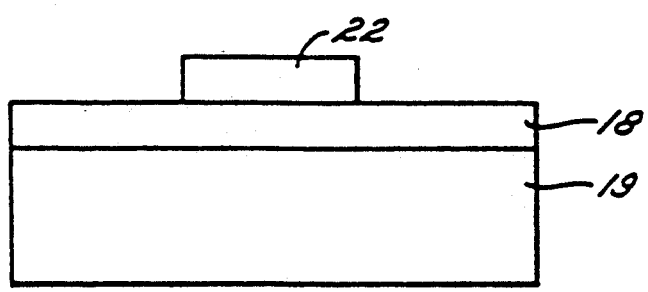

One embodiment of this technique is shown in the cross-sectional views of FIGS. 20a through 20c. As shown in FIG. 20a, a semiconductor substrate 19 is used having a layer of insulation 18 formed thereon. Formed on insulation layer 18 is a layer of polycrystalline silicon 20. A masking layer, such as a layer of photoresist, is applied and then patterned to provide photoresist 23 which protects that portion 22 of polycrystalline silicon layer 20 which is to remain as the gate electrode. The exposed portion of polycrystalline silicon layer 20 is then doped in order to decrease its dopant concentration. The remaining portion of photoresist is then removed, as shown in FIG. 20b. The lightly doped portion 22 can now be removed by use of a diffusion pattern. Using the novel etching technique of this invention, the more highly doped portions of polycrystalline silicon layer 20 are then removed, as shown in FIG. 20c, leaving the more lightly doped portion 22 of polycrystalline silicon layer 20, which then serves as a gate electrode.

The specific embodiments of this invention described in this specification are intended to serve by way of example and are not a limitation of the scope of my invention. Numerous other embodiments of this invention will become apparent to those of ordinary skill in the art in light of the teachings of this invention. The principles of this invention can be used to fabricate dielectrically isolated regions of other than silicon, for example germanium, gallium arsenide, or other semiconductor formed of elements from Groups III and V of the periodic table.

All publications and patent applications are herein incorporated by reference to the same extent as if each individual publication or patent application was specifically and individually indicated to be incorporated by reference. The invention now being fully described, it will be apparent to one of ordinary skill in the art that many changes and modifications can be made thereto without departing from the spirit or scope of the appended claims.

What is claimed is:

1. A method for fabricating dielectrically isolated single crystal semiconductor regions utilizing a first and a second substrate, and having first and second surfaces, comprising the steps of:
   forming a layer of epitaxial semiconductor on said first surface of said first substrate;
   forming a masking layer on said layer of epitaxial semiconductor to expose selected portions of said layer of epitaxial semiconductor where isolation regions are to be formed;
   forming isolation regions in said selected substrate where exposed by said making layer;
   subsequent to said step of forming isolation regions, forming a dielectric layer on said first surface of said second substrate and/or the surface of said layer of epitaxial semiconductor;
   joining said layer of epitaxial semiconductor and said first surface of said second substrates together; and
   removing a selected one of said first and second substrates, leaving said epitaxial layer, using a plasma etch wherein RF energy is introduced into the one of said first and second substrates other than that selected for removal.

2. The method as in claim 1 wherein said second substrate is a handle comprising a material selected from the group of materials consisting of semiconductors, insulators, and ceramics.

3. The method as in claim 1 wherein said first substrate comprises a material selected from the group of materials consisting of silicon, germanium, gallium arsenide, and semiconductor compounds formed from elements of Group III and Group V of the periodic table.

4. The method of claim 3 wherein said selected substrate is more highly doped than said layer of epitaxial semiconductor.

5. The method of claim 1 wherein said selected substrate is etched, and said layer of epitaxial semiconductor is not.

6. The method of claim 5 wherein a layer of polymer is deposited by said plasma on said layer of epitaxial semiconductor after said selected substrate is removed, thereby preventing removal of said layer of epitaxial semiconductor.

7. The method as in claim 1 wherein said isolation regions are also formed on scribe lines between adjacent die formed in said first and second substrates.

8. The method as in claim 1 wherein said step of joining is performed under pressure.

9. The method as in claim 1 wherein said step of joining under pressure is preceded by a hydration bake of one or both of said first and second substrates.

10. The method as in claim 9 wherein said hydration bake is performed within the range of approximately 400° C. to 900° C.

11. The method as in claim 1 wherein said step of joining under pressure is performed at a pressure within the range of approximately 15 to 25 atmospheres.

12. The method as in claim 11 wherein said step of joining under pressure is performed at approximately 700° C.

13. The method as in claim 1 wherein said step of joining under pressure occurs in a steam environment.

14. The method as in claim 1 wherein said step of forming isolation region comprises the steps of:
   forming a trench in said layer of epitaxial semiconductor;
   forming a layer of insulation on at least the sides of said trench; and
   filling said trench with a filler material.

15. The method as in claim 1 wherein said filler material comprises polycrystalline semiconductor material.

16. The method as in claim 1 wherein said step of forming isolation regions comprises the steps of:
   forming a trench in said layer of epitaxial semiconductor; and
   filling said trench with an insulation material.

17. A method for fabricating dielectrically isolated single crystal semiconductor regions utilizing a first and a second substrate, and having first and second surfaces, comprising the steps of:
   forming a layer of epitaxial semiconductor on said first surface of said first substrate;
   forming a masking layer on said layer of epitaxial semiconductor to expose selected portions of said layer of epitaxial semiconductor where isolation regions are to be formed;
   forming isolation regions in said selected substrate where exposed by said masking layer.
   forming a dielectric layer on said first surface of said second substrate and/or the surface of said layer of epitaxial semiconductor;
   either before or after said step of forming isolation regions, joining said layer of epitaxial semiconductor and said first surface of said second substrates together; and
   removing a selected one of said first and second substrates, leaving said epitaxial layer, by a plasma etch wherein RF energy is introduced into the one of said first and second substrates other than that selected for removal such that said selected substrate is etched, and said layer of epitaxial semiconductor is not.

18. The method as in claim 17 wherein said isolation regions are also formed on scribe lines between adjacent die formed in said first and second substrates.

19. The method as in claim 17 wherein said second substrate is a handle comprising a material selected from the group of materials consisting of semiconductors, insulators, and ceramics.

20. The method as in claim 17 wherein said first substrate comprises a material selected from the group of materials consisting of silicon, germanium, gallium arsenide, and semiconductor compounds formed from elements of Group III or Group V of the periodic table.

21. The method of claim 17 wherein a layer of polymer is deposited by said plasma on said layer of epitaxial semiconductor after said selected substrate is removed, thereby preventing removal of said layer of epitaxial semiconductor.

22. The method of claim 17 wherein said selected substrate is more highly doped than said layer of epitaxial semiconductor.

23. The method as in claim 17 wherein said step of joining is performed under pressure.

24. The method as in claim 23 wherein said step of joining under pressure occurs in a steam environment.

25. The method as in claim 23 wherein said pressure is within the range of approximately 15 to 15 atmospheres.

26. The method as in claim 25 wherein said step of joining under pressure is performed at a temperature of approximately 700° C.

27. The method as in claim 23 wherein said step of joining is preceded by a hydration bake of one or both of said first and second substrates.

28. The method as in claim 27 wherein said hydration bake is performed within the range of approximately 400° C. to 900° C.

29. The method as in claim 17 wherein said step of forming isolation region comprises the steps of:
   forming a trench in said layer of epitaxial semiconductor;
   forming a layer of insulation on at least the sides of said trench; and
   filling said trench with a filler material.

30. The method as in claim 29 wherein said filler material comprise, polycrystalline semiconductor material.

31. The method as in claim 17 wherein said step of forming isolation regions comprises the steps of:
   forming a trench in said layer of epitaxial semiconductor; and
   filling said trench with an insulation material.

* * * * *